United States Patent [19]

Skatvold, Jr.

[11] 4,275,364
[45] Jun. 23, 1981

[54] RESONANT ELEMENT TRANSFORMER

[75] Inventor: Arthur R. Skatvold, Jr., Ridgecrest, Calif.

[73] Assignee: The United States of America as represented by the Secretary of the Navy, Washington, D.C.

[21] Appl. No.: 78,331

[22] Filed: Sep. 24, 1979

[51] Int. Cl.³ .............................................. H01P 5/02
[52] U.S. Cl. ...................................... 333/33; 333/116
[58] Field of Search ................................. 333/33, 116

[56] References Cited

U.S. PATENT DOCUMENTS

| | | |
|---|---|---|
| 3,419,813 | 12/1968 | Kamnitsis . |
| 3,601,716 | 8/1971 | Bolt et al. ............................ 333/116 |
| 3,761,843 | 9/1973 | Cappucci ............................ 333/35 X |
| 3,778,735 | 12/1973 | Steenmetser . |
| 3,921,056 | 11/1975 | Mahoney . |
| 3,965,445 | 6/1976 | Ou ........................................ 333/33 |
| 3,969,689 | 7/1976 | Corrons et al. . |
| 4,013,974 | 3/1977 | Quine . |
| 4,127,832 | 11/1978 | Riblet . |

*Primary Examiner*—Paul L. Gensler
*Attorney, Agent, or Firm*—R. S. Sciascia; W. Thom Skeer; Kenneth G. Pritchard

[57] ABSTRACT

An impedance matching device is created for transforming electrical impedances. The device has more stability at low impedances. A pair of coplanar coupled transmission line conductors are placed on a dielectric substrate so as to form a four port impedance device. The electrical parameters of the device, such as electrical length and even and odd mode impedance, are selected from design parameters determined by evaluating a determinant matched to a complex load impedance $Z_r$. A specific example of matching a standard 50 ohm transmission line to an IMPATT diode is disclosed.

8 Claims, 4 Drawing Figures

3a

3b

RESONANT ELEMENT TRANSFORMER

BACKGROUND OF THE INVENTION

1. Field of the Invention

This invention pertains to transformers and specifically to coupled transmission line impedance transformers for very low impedances.

2. Description of the Prior Art

There are many prior art patents detailing the many applications where it is desired to transform electrical impedances from one value to another. A very common application is the matching of input and output impedances between the standard 50 ohm transmission line and low impedance level electronic devices such as diodes and transistors. Previously, microstrip impedance matching was one of several methods which could be used. As electronics has gone to lower and lower impedances, the microstrip method was found less applicable because conventional microstrip techniques could not match low impedances.

Among the known techniques for providing impedance transformation is U.S. Pat. No. 3,965,445 to Ou titled MICROSTRIP OR STRIP LINE COUPLED TRANSMISSION LINE IMPEDANCE TRANSFORMER. The Ou patent is based on two articles, one by E. M. T. Jones and J. T. Bolljohn, "Coupled Strip-Transmission-Line Filters and Directional Couplers" from IRE Transactions on Microwave Theory and Techniques (April 1956), pages 75–81 and a second article "Parameters of Microstrip Transmission Lines and Coupled Pairs of Microstrip Lines", IEEE Transactions on Microwave Theory and Techniques, Vol. MTT-16, No. 12 (December 1968) by T. G. Bryant and J. A. Weiss. These articles show some of the basic fundamentals used in coupled transmission transformers.

The technique shown in the Ou patent relies on coplanar coupled transmission line conductors on a dielectric substrate which are tuned by attached capacitors. While the Ou patent specifically shows using coupled transmission lines of a quarter wavelength electrical length, $\theta$, Ou states that $\theta$ is not critical. This is because the capacitors permit tuning for any irregularities caused by poor match of electrical length. The use of capacitors for tuning the imaginary component results in the use of such things as gold wire, epoxy and other electrical conductors and insulators which will fatique and break down with repeated use. Due to the nature of such miniaturized electronic devices component breakdown frequently results. Repair requires the complete unit to be disassembled or the appropriate components replaced in their entirety.

Thus, an advancement of the art clearly called for is the use of coupled transmission lines resonant transformers which are not subject to tuning conditions and can be used for low impedances. This requires that the resonant element transformers or impedance matching devices be specifically designed to have a natural oscillation or resonance at the desired frequencies.

SUMMARY OF THE INVENTION

A low impedance matching device is created by depositing a pair of coplanar coupled metalized transmission line conductors on an alumina substrate in the form of a four port impedance device. The controlling electrical parameters, electrical length, $\theta$ and even and odd mode impedances, $Z_{oe}$ and $Z_{oo}$, depend on the transmission line geometries. Furthermore, the coupling coefficient K is also determined by the geometry of coupled line width and spacing. This can be expressed as $K=(Z_{oe}-Z_{oo})\div(Z_{oo}+Z_{oo})$ such that the coupling in decibels, dB, is $dB=20 \log K$. The coupling value in dB is used to calculate the coupled microstrip parameters.

This technique is used to balance a complex impedance load, $Z_r$, and is specifically applicable to the standard 50 ohm transmission line matching problem if 2 ports of a four port device are considered open circuits. This technique permits greater ease in matching because it calls for greater spacing between the coupled lines as the impedance decreases. Increased distance lessens sensitivity to slight errors in spacing the lines.

A method of producing a resonant element transformer for any desired coupling transmission is created by designing a coupled transmission line device which selects the appropriate family or parameters with the $Z_r$ desired.

DETAILED DESCRIPTION OF THE PREFERRED EMBODIMENT

Figure 1:
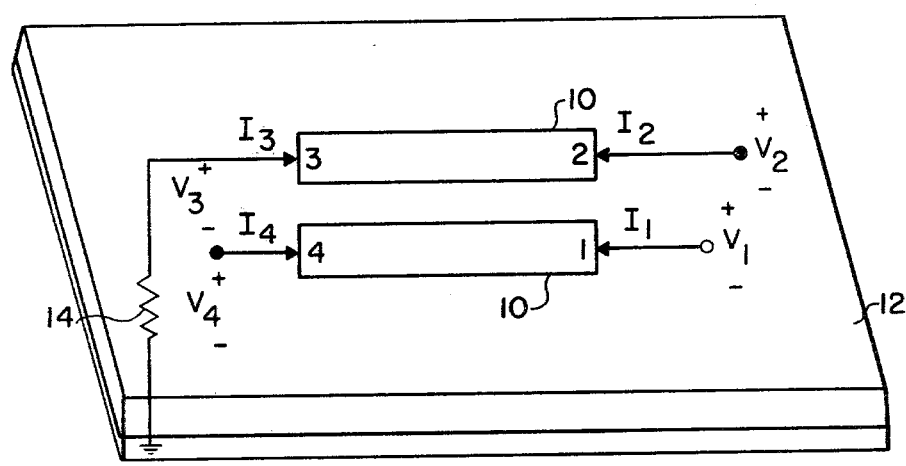
FIG. 1 is a diagram of the preferred embodiment of the present invention.

FIG. 1 shows a pair of coplanar transmission lines 10 on a dielectric substrate 12. While any possible combination of dielectric and conducting material can be used, an alumina substrate is one example which can be used with transmission lines of deposited gold or etched in gold. Transmission lines 10 have four ports 1 through 4 as shown. Each of the four ports has an associated voltage $V_1$-$V_4$. Port 3 is shown grounded through a resistance load 14. Port 3 can be grounded to any external ground, such as a ground plane on the reverse side of dielectric substrate 12.

Coupled microstrip lines 10 can be described utilizing a four port impedance $Z_{ij}$ defined as:

$$\begin{bmatrix} V_1 \\ V_2 \\ V_3 \\ V_4 \end{bmatrix} = \begin{bmatrix} Z_{11} & Z_{12} & Z_{13} & Z_{14} \\ Z_{21} & Z_{22} & Z_{23} & Z_{24} \\ Z_{31} & Z_{32} & Z_{33} & Z_{34} \\ Z_{41} & Z_{42} & Z_{43} & Z_{44} \end{bmatrix} \begin{bmatrix} I_1 \\ I_2 \\ I_3 \\ I_4 \end{bmatrix}$$

It can be shown mathematically that impedances $Z_{ij}$ are $$Z_{11} = Z_{22} = Z_{33} = Z_{44} = -j(Z_{oe} + Z_{oo})\frac{\cot \theta}{2}$$

$$Z_{12} = Z_{21} = Z_{34} = Z_{43} = -j(Z_{oe} - Z_{oo})\frac{\cot \theta}{2}$$

$$Z_{13} = Z_{31} = Z_{24} = Z_{42} = -j(Z_{oe} - Z_{oo})\frac{\csc \theta}{2}$$

$$Z_{14} = Z_{41} = Z_{23} = Z_{32} = -j(Z_{oe} + Z_{oo})\frac{\csc \theta}{2}$$

where $\theta$ is the electrical length of the coupled lines, and $Z_{oe}$ and $Z_{oo}$ are the even and odd mode impedances which depend on transmission line geometry.

Figure 2:
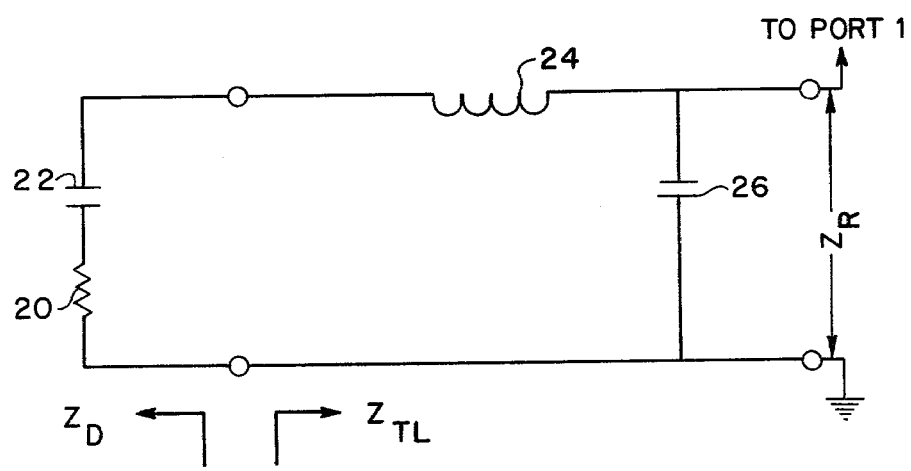
FIG. 2 is a diagram of a typical IMPATT diode load for the present invention.

FIG. 2 is a representation of an IMPATT diode chip ($Z_D$) and the package parasitic elements. Such a circuit for microwave oscillation requires a conjugate match between diode impedance $Z_D$ and the external circuit or total load impedance $Z_{TL}$. The impedance of an IMPATT diode chip is usually described as a negative resistance 20 characterized by a value such as $-R_d$ in series with junction capacitor 22, $C_j$. Also included of the parasitic elements a series inductance 24, $L_t$, and a shunt capacitance 26, $C_P$. $Z_D$ and $Z_{TL}$ are complex impedances with $Z_D$ being a function of radio frequency power, bias, and frequency. $Z_{TL}$ is primarily a function of frequency. For a further description of IMPATT diodes, the reader is referred to "Some Basic Characteristics of Broad Band Negative Resistance Oscillators Circuits" "Bell System Technical Journal", 48, No. 6 (July August 1969) 1937-55 by K. Kurokwa.

For the specific case where resistance 14 in FIG. 1 is 50 ohms, the IMPATT diode and package parasitics as shown in FIG. 2 can be considered a load tied to port 1 of FIG. 1. The following is merely one example where a microwave integrated circuit can be tied to a standard 50 ohm transmission line with use of an impact ionization avalanche transit time, IMPATT, source. Ports 2 and 4 are open circuits, port 1 has a load applied with a complex impedance $Z_r$ and port 3 is terminated in a resistance matching the transmission line, in this case 50 ohms. The following conditions then exist, of the four possible currents $I_1$ through $I_4$ shown in FIG. 1 which flow into the coupled conductors 10, currents $I_2$ and $I_4$ are zero. $Z_2 = V_1/I_1$ and $V_3 = -50 I_3$.

Inserting the first two conditions into the impedance matrix and multiplying yields the result $$V_1 = Z_{11}I_1 + Z_{13}I_3$$

$$V_2 = Z_{21}I_1 + Z_{23}I_3$$

$$V_3 = Z_{31}I_1 + Z_{33}I_3$$

$$V_4 = Z_{41}I_1 + Z_{43}I_3$$

Using the third condition, $V_3 = -50 I_3$, and these four equations results in a solution $Z_r$ where $$Z_r = \frac{V_1}{I_1} = Z_{11} - \frac{Z_{13}^2}{Z_{11} + 50}$$

This equation is a function of the electrical length of the coupled lines and the even and odd mode impedance. $Z_{oe}$ and $Z_{oo}$ are determined by the coupled line widths and spacing which can be described by a coupling coefficient, K, where $$K = \frac{Z_{oe} - Z_{oo}}{Z_{oe} + Z_{oo}}.$$

The coupling in dB is dB=20 log K.

Figure 3:
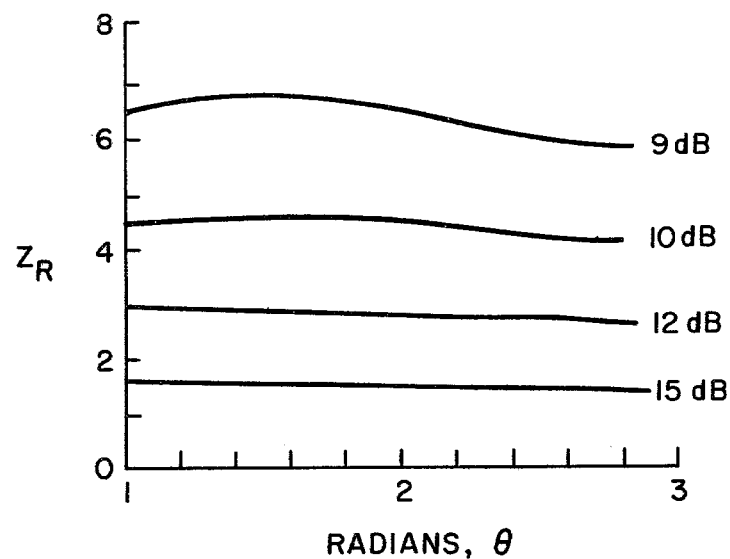
FIG. 3a and 3b show how a particular electrical length can be chosen for a given complex impedance $Z_r$.
Figure 3:
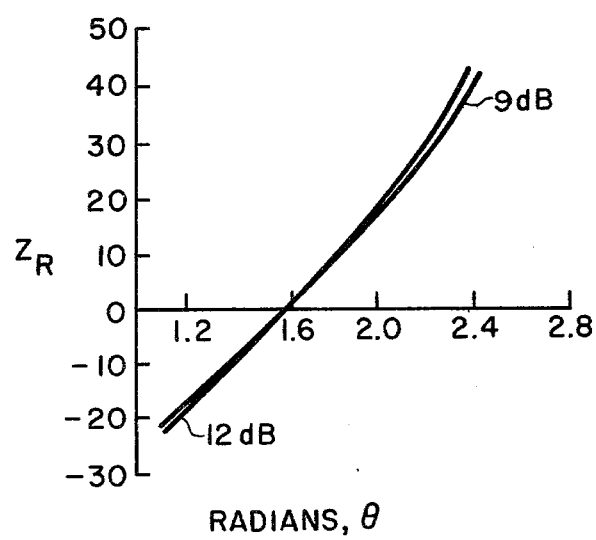

The equation for $Z_r$ is plotted in FIGS. 3a and 3b. FIG. 3a shows the real part of $Z_r$ vs the coupling length $\theta$ for several coupling values in dB. A nearly independent relationship is shown between the real part of $Z_r$ and coupling length and a direct dependence between the real part of $Z_r$ and the coupling coefficient. FIG. 3b shows a nearly independent relationship between the imaginary part of $Z_r$ and the coupling coefficient but direct dependence on the coupling length. A physical advantage of the resonant element transformer is that the lower the real part of $Z_r$ becomes, the greater the space between the coupled lines. Since IMPATTS have very low impedances, the increasing distance provides greater dimensional stability. This feature provides a convenient repeatable device for impedance matching to low impedances. Referring back to FIG. 2, it can be seen that in general the complex impedance $Z_r$ will normally have a positive value for its imaginary part as shown in FIG. 3b. In general, the load connected will normally be capacitive rather than inductive although the lower tail of $Z_r$ in FIG. 3b can become an inductive load.

While the above description is shown for a specific example of coupling transformer design, it will be apparent to those skilled in the art that many variations of design can be possible depending on the specific impedance loads, $Z_r$, desired. An impedance load can be matched using the above method with a wide variety of parameter choices possible.

What is claimed is:

1. An impedance matching device which is a resonant element transformer comprising:
   a substrate of dielectric material; and
   a pair of coplanar coupled transmission line conductors placed on said substrate and can be described as four-port impedance $Z_{ij}$ defined as $$\begin{bmatrix} V_1 \\ V_2 \\ V_3 \\ V_4 \end{bmatrix} = \begin{bmatrix} Z_{11} & Z_{12} & Z_{13} & Z_{14} \\ Z_{21} & Z_{22} & Z_{23} & Z_{24} \\ Z_{31} & Z_{32} & Z_{33} & Z_{34} \\ Z_{41} & Z_{42} & Z_{43} & Z_{44} \end{bmatrix} \begin{bmatrix} I_1 \\ I_2 \\ I_3 \\ I_4 \end{bmatrix}$$

where
   $V_i$ = voltage at each port i=1,2,3 or 4,
   $I_i$ = current at each port i=1,2,3 or 4, $$Z_{11} = Z_{22} = Z_{33} = Z_{44} = -j(Z_{oe} + Z_{oo})\frac{\cot \theta}{2},$$

$$Z_{12} = Z_{21} = Z_{34} = Z_{43} = -j(Z_{oe} - Z_{oo})\frac{\cot \theta}{2},$$

$$Z_{13} = Z_{31} = Z_{24} = Z_{42} = -j(Z_{oe} - Z_{oo})\frac{\csc \theta}{2},$$

$$Z_{14} = Z_{41} = Z_{23} = Z_{32} = -j(Z_{oe} + Z_{oo})\frac{\csc \theta}{2},$$

$Z_{oe}$ and $Z_{oo}$ are the even and odd mode impedances,
$\theta$ = electrical length of said coupled transmission lines,
j = imaginary coefficient, $\sqrt{-1}$, and $Z_r$ = a complex impedance of a load to be matched connected at port 1, such that the parameters $Z_{ij}$, $Z_{oe}$, $Z_{oo}$ and $\theta$ are chosen to match $Z_r$ to a predetermined network whose characteristic resistance is terminating port 3 and where ports 2 and 4 are open circuits.

2. An impedance matching device as described in claim 1 wherein said substrate is comprised of alumina.

3. An impedance matching device as described in either claim 1 or claim 2 wherein said transmission line conductors comprise deposited gold lines on said substrate.

4. An impedance matching device as described in claim 1 where said third port is terminated in 50 ohms.

5. An impedance matching device as described in claim 4 wherein said substrate is comprised of alumina and said transmission line conductors are etched in gold on said substrate.

6. A method of matching a complex impedance, $Z_r$, to a predetermined circuit comprising the steps of:
   placing a pair of coplanar coupled transmission line conductors on a dielectric substrate which can be described as four-port impedances, $Z_{ij}$, and have the electrical properties, $\theta$ = electrical length of the coupled lines, and $Z_{oe}$ and $Z_{oo}$ = even and odd mode impedances respectively, chosen from a set of parameters defined by, $$\begin{bmatrix} V_1 \\ V_2 \\ V_3 \\ V_4 \end{bmatrix} = \begin{bmatrix} Z_{11} & Z_{12} & Z_{13} & Z_{14} \\ Z_{21} & Z_{22} & Z_{23} & Z_{24} \\ Z_{31} & Z_{32} & Z_{33} & Z_{34} \\ Z_{41} & Z_{42} & Z_{43} & Z_{44} \end{bmatrix} \begin{bmatrix} I_1 \\ I_2 \\ I_3 \\ I_4 \end{bmatrix}$$

$V_i$ = voltage at each port i = 1,2,3 or 4,
$I_i$ = current at each port i = 1,2,3 or 4, $$Z_{11} = Z_{22} = Z_{33} = Z_{44} = -j(Z_{oe} + Z_{oo})\frac{\cot\theta}{2},$$

-continued $$Z_{12} = Z_{21} = Z_{34} = Z_{43} = -j(Z_{oe} - Z_{oo})\frac{\cot\theta}{2},$$

$$Z_{13} = Z_{31} = Z_{24} = Z_{42} = -j(Z_{oe} - Z_{oo})\frac{\csc\theta}{2},$$

$$Z_{14} = Z_{41} = Z_{23} = Z_{32} = -j(Z_{oe} + Z_{oo})\frac{\csc\theta}{2},$$

connecting said complex impedances $Z_r$, to port 1, terminating port 3 with a resistance characteristic of said circuit to be matched, and leaving ports 2 and 4 as open circuits.

7. A method of matching a complex impedance, $Z_r$, to a predetermined circuit as described in claim 6 where said third port is terminated in 50 ohms.

8. A method of matching a complex impedance, $Z_r$, to a predetermined circuit as described in either claim 6 or claim 7 wherein said substrate is comprised of alumina and said pair of line conductors are etched in gold on said substrate.

* * * * *